United States Patent
Koniaris et al.

(10) Patent No.: US 8,420,472 B2
(45) Date of Patent: Apr. 16, 2013

(54) SYSTEMS AND METHODS FOR INTEGRATED CIRCUITS COMPRISING MULTIPLE BODY BIASING DOMAINS

(76) Inventors: Kleanthes G. Koniaris, Palo Alto, CA (US); Robert Paul Masleid, Monte Sereno, CA (US); James B. Burr, Foster City, CA (US)

( * ) Notice: Subject to any disclaimer, the term of this patent is extended or adjusted under 35 U.S.C. 154(b) by 75 days.

(21) Appl. No.: 12/873,062

(22) Filed: Aug. 31, 2010

(65) Prior Publication Data

US 2010/0321098 A1   Dec. 23, 2010

Related U.S. Application Data

(60) Division of application No. 11/400,368, filed on Apr. 6, 2006, now Pat. No. 7,816,742, which is a division of application No. 10/956,722, filed on Sep. 30, 2004, now Pat. No. 7,859,062, which is a continuation-in-part of application No. 10/771,015, filed on Feb. 2, 2004, now Pat. No. 7,205,758.

(51) Int. Cl.
   *H01L 29/72* (2006.01)
(52) U.S. Cl.
   USPC ............ 438/199; 438/200; 257/371; 327/534
(58) Field of Classification Search .................. 438/199, 438/200; 257/371; 327/534
   See application file for complete search history.

(56) References Cited

U.S. PATENT DOCUMENTS

| | | |
|---|---|---|
| 5,086,501 A | 2/1992 | DeLuca et al. |
| 5,096,084 A | 3/1992 | Wells |
| 5,146,298 A | 9/1992 | Eklund |
| 5,167,024 A | 11/1992 | Smith et al. |
| 5,201,059 A | 4/1993 | Nguyen |
| 5,204,863 A | 4/1993 | Saint-Joigny et al. |
| 5,218,704 A | 6/1993 | Watts, Jr. et al. |

(Continued)

FOREIGN PATENT DOCUMENTS

| | | |
|---|---|---|
| EP | 0381021 | 8/1990 |
| EP | 0474963 | 3/1992 |

(Continued)

OTHER PUBLICATIONS

Final Office Action Dated Mar. 16, 2010; U.S. Appl. No. 11/400,368.

(Continued)

*Primary Examiner* — Edward Wojciechowicz

(57) ABSTRACT

Systems and methods for integrated circuits comprising multiple body biasing domains. In accordance with a first embodiment of the present invention, a semiconductor structure comprises a substrate of first type material. A first closed structure comprising walls of second type material extends from a surface of the substrate to a first depth. A planar deep well of said second type material underlying and coupled to the closed structure extends from the first depth to a second depth. The closed structure and the planar deep well of said second type material form an electrically isolated region of the first type material. A second-type semiconductor device is disposed to receive a first body biasing voltage from the electrically isolated region of the first type material. A well of the second-type material within the electrically isolated region of the first type material is formed and a first-type semiconductor device is disposed to receive a second body biasing voltage from the well of second-type material.

20 Claims, 5 Drawing Sheets

U.S. PATENT DOCUMENTS

| | | |
|---|---|---|
| 5,230,055 A | 7/1993 | Katz et al. |
| 5,239,652 A | 8/1993 | Seibert et al. |
| 5,243,559 A | 9/1993 | Murai |
| 5,422,591 A | 6/1995 | Rastegar et al. |
| 5,422,806 A | 6/1995 | Chen et al. |
| 5,440,520 A | 8/1995 | Schutz et al. |
| 5,461,266 A | 10/1995 | Koreeda et al. |
| 5,502,838 A | 3/1996 | Kikinis |
| 5,511,203 A | 4/1996 | Wisor et al. |
| 5,519,309 A | 5/1996 | Smith |
| 5,560,020 A | 9/1996 | Nakatani et al. |
| 5,592,173 A | 1/1997 | Lau et al. |
| 5,610,533 A * | 3/1997 | Arimoto et al. .................. 326/33 |
| 5,682,093 A | 10/1997 | Kivela |
| 5,692,204 A | 11/1997 | Rawson et al. |
| 5,717,319 A | 2/1998 | Jokinen |
| 5,719,800 A | 2/1998 | Mittal et al. |
| 5,727,208 A | 3/1998 | Brown |
| 5,745,375 A | 4/1998 | Reinhardt et al. |
| 5,752,011 A | 5/1998 | Thomas et al. |
| 5,754,869 A | 5/1998 | Holzhammer et al. |
| 5,757,171 A | 5/1998 | Babcock |
| 5,778,237 A | 7/1998 | Yamamoto et al. |
| 5,812,860 A | 9/1998 | Horden et al. |
| 5,815,724 A | 9/1998 | Mates |
| 5,825,674 A | 10/1998 | Jackson |
| 5,848,281 A | 12/1998 | Smalley et al. |
| 5,880,620 A | 3/1999 | Gitlin et al. |
| 5,884,049 A | 3/1999 | Atkinson |
| 5,894,577 A | 4/1999 | MacDonald et al. |
| 5,923,545 A | 7/1999 | Nguyen |
| 5,933,649 A | 8/1999 | Lim et al. |
| 5,940,785 A | 8/1999 | Georgiou et al. |
| 5,940,786 A | 8/1999 | Steeby |
| 5,973,526 A | 10/1999 | Dabral |
| 5,974,557 A | 10/1999 | Thomas et al. |
| 5,996,083 A | 11/1999 | Gupta et al. |
| 5,996,084 A | 11/1999 | Watts |
| 6,023,186 A | 2/2000 | Kuroda |
| 6,035,407 A | 3/2000 | Gebara et al. |
| 6,047,248 A | 4/2000 | Georgiou et al. |
| 6,048,746 A | 4/2000 | Burr |
| 6,055,644 A | 4/2000 | Henkel |
| 6,055,655 A | 4/2000 | Momohara |
| 6,078,319 A | 6/2000 | Bril et al. |
| 6,087,892 A | 7/2000 | Burr |
| 6,091,283 A | 7/2000 | Murgula et al. |
| 6,097,242 A | 8/2000 | Forbes et al. |
| 6,118,306 A | 9/2000 | Orton et al. |
| 6,119,241 A | 9/2000 | Michail et al. |
| 6,157,092 A | 12/2000 | Hofmann |
| 6,202,104 B1 | 3/2001 | Ober |
| 6,216,235 B1 | 4/2001 | Thomas et al. |
| 6,218,708 B1 | 4/2001 | Burr |
| 6,218,892 B1 | 4/2001 | Soumyanath et al. |
| 6,218,895 B1 | 4/2001 | De et al. |
| 6,232,793 B1 | 5/2001 | Arimoto et al. |
| 6,232,827 B1 | 5/2001 | De et al. |
| 6,272,642 B2 | 8/2001 | Pole, II et al. |
| 6,272,666 B1 * | 8/2001 | Borkar et al. .................. 716/113 |
| 6,279,048 B1 | 8/2001 | Fadavi-Ardekani et al. |
| 6,303,444 B1 | 10/2001 | Burr |
| 6,304,824 B1 | 10/2001 | Bausch et al. |
| 6,311,287 B1 | 10/2001 | Dischler et al. |
| 6,314,522 B1 | 11/2001 | Chu et al. |
| 6,333,571 B1 | 12/2001 | Teraoka et al. |
| 6,341,087 B1 | 1/2002 | Kunikiyo |
| 6,345,363 B1 | 2/2002 | Levy-Kendler |
| 6,347,379 B1 | 2/2002 | Dai et al. |
| 6,378,081 B1 | 4/2002 | Hammond |
| 6,388,432 B2 | 5/2002 | Uchida |
| 6,392,467 B1 | 5/2002 | Oowaki et al. |
| 6,411,156 B1 | 6/2002 | Borkar et al. |
| 6,415,388 B1 | 7/2002 | Browning et al. |
| 6,425,086 B1 | 7/2002 | Clark et al. |
| 6,427,211 B2 | 7/2002 | Watts, Jr. |
| 6,442,746 B1 | 8/2002 | James et al. |
| 6,456,157 B1 | 9/2002 | Forbes et al. |
| 6,457,135 B1 | 9/2002 | Cooper |
| 6,466,077 B1 | 10/2002 | Miyazaki et al. |
| 6,477,654 B1 | 11/2002 | Dean et al. |
| 6,484,265 B2 | 11/2002 | Borkar et al. |
| 6,487,668 B2 | 11/2002 | Thomas et al. |
| 6,489,224 B1 | 12/2002 | Burr |
| 6,510,400 B1 | 1/2003 | Moriyama |
| 6,510,525 B1 | 1/2003 | Nookala et al. |
| 6,513,124 B1 | 1/2003 | Furuichi et al. |
| 6,518,826 B2 | 2/2003 | Zhang |
| 6,519,706 B1 | 2/2003 | Ogoro |
| 6,574,739 B1 | 6/2003 | Kung et al. |
| 6,600,346 B1 | 7/2003 | Macaluso |
| 6,614,301 B2 | 9/2003 | Casper et al. |
| 6,621,325 B2 | 9/2003 | Hart et al. |
| 6,653,890 B2 | 11/2003 | Ono et al. |
| 6,731,157 B2 | 5/2004 | Fulkerson |
| 6,777,978 B2 | 8/2004 | Hart et al. |
| 6,784,722 B2 | 8/2004 | Tang et al. |
| 6,792,379 B2 | 9/2004 | Ando |
| 6,794,630 B2 | 9/2004 | Keshavarzi et al. |
| 6,812,758 B2 | 11/2004 | Gauthier et al. |
| 6,847,252 B1 | 1/2005 | Ono et al. |
| 6,858,897 B2 | 2/2005 | Chen |
| 6,864,539 B2 | 3/2005 | Ishibashi et al. |
| 6,912,156 B2 | 6/2005 | Sakurai et al. |
| 6,967,522 B2 | 11/2005 | Chandrakasan et al. |
| 6,992,508 B2 | 1/2006 | Chow |
| 7,129,745 B2 | 10/2006 | Lewis et al. |
| 7,205,758 B1 | 4/2007 | Masleid et al. |
| 7,334,198 B2 | 2/2008 | Ditzel et al. |
| 7,348,827 B2 | 3/2008 | Rahim et al. |
| 2002/0002689 A1 | 1/2002 | Yeh |
| 2002/0029352 A1 | 3/2002 | Borkar et al. |
| 2002/0030533 A1 | 3/2002 | De et al. |
| 2002/0033510 A1 | 3/2002 | Tomita |
| 2002/0056597 A1 | 5/2002 | Honsberg et al. |
| 2002/0073348 A1 | 6/2002 | Tani |
| 2002/0083356 A1 | 6/2002 | Dai |
| 2002/0087896 A1 | 7/2002 | Cline et al. |
| 2002/0113628 A1 | 8/2002 | Ajit |
| 2002/0116650 A1 | 8/2002 | Halepete et al. |
| 2002/0138778 A1 | 9/2002 | Cole et al. |
| 2002/0140494 A1 | 10/2002 | Thomas et al. |
| 2002/0178390 A1 | 11/2002 | Lee |
| 2002/0194509 A1 | 12/2002 | Plante et al. |
| 2003/0005378 A1 | 1/2003 | Tschanz et al. |
| 2003/0021161 A1 | 1/2003 | Fifield et al. |
| 2003/0036876 A1 | 2/2003 | Fuller, III et al. |
| 2003/0037068 A1 | 2/2003 | Thomas et al. |
| 2003/0063513 A1 | 4/2003 | Tsunoda et al. |
| 2003/0065960 A1 | 4/2003 | Rusu et al. |
| 2003/0074591 A1 | 4/2003 | McClendon et al. |
| 2003/0080802 A1 | 5/2003 | Ono et al. |
| 2003/0132735 A1 | 7/2003 | Fulkerson |
| 2003/0149988 A1 | 8/2003 | Ellis et al. |
| 2004/0014268 A1 | 1/2004 | Ishibashi et al. |
| 2004/0016977 A1 | 1/2004 | Miyazaki et al. |
| 2004/0021501 A1 | 2/2004 | Das et al. |
| 2004/0025061 A1 | 2/2004 | Lawrence |
| 2004/0073821 A1 | 4/2004 | Naveh et al. |
| 2004/0109354 A1 | 6/2004 | Wang et al. |
| 2004/0123170 A1 | 6/2004 | Tschanz et al. |
| 2004/0125644 A1 | 7/2004 | Komatsuzaki |
| 2004/0128631 A1 | 7/2004 | Ditzel et al. |
| 2004/0155696 A1 | 8/2004 | Gauthier et al. |
| 2004/0217372 A1 | 11/2004 | Chen |
| 2005/0160465 A1 | 7/2005 | Walker |
| 2005/0225376 A1 | 10/2005 | Kin Law |
| 2005/0237083 A1 | 10/2005 | Bakker et al. |
| 2005/0280437 A1 | 12/2005 | Lewis et al. |
| 2006/0157818 A1 | 7/2006 | Williams et al. |
| 2006/0223257 A1 | 10/2006 | Williams et al. |

FOREIGN PATENT DOCUMENTS

| | | |
|---|---|---|
| EP | 0501655 | 9/1992 |
| JP | 409185589 | 7/1997 |
| WO | 0127728 | 4/2001 |

OTHER PUBLICATIONS

Requirement for Restriction/Election Dated Oct. 14, 2009; U.S. Appl. No. 11/400,368.

Notice of Allowance Dated Apr. 16, 2010, U.S. Appl. No. 11/880,351.

"High-Speed, Digitally Adjusted Stepdown Controllers for Notebook CPUS", Maxim Manual, Jul. 2000, pp. 1-28.

"Wafer Burn-In Isolation Circuit"; IBM Technical Disclosure Bulletin; IBM Corp, New York, US, vol. 32, No. 6B, Nov. 1, 1989, pp. 442-443; XP00073858 ISSN: 0018-8689 (The Whole Document).

Baker, K., et al,; "Shmoo Plotting: The Black Art of IC Testing"; IEEE Design & Test of Computers, IEEE vol. 14, No. 3; Jul. 1, 1997, pp. 90-97, XP000793305 ISSN: 0740-7475 (the whole document).

Computer Software, Wikipedia; "http://en.wikipedia.org/wiki/Software"; retrieved on May 2, 2007.

Desai, et al.; "Sizing of Clock Distribution Networks for High Performance CPU Chips"; Digital Equipment Corporation, Hudson, MA, Jun. 1996, pp. 389-394.

"LTC 1736 Product", Linear Technology Manual, Jan. 1999, pp. 1-28.

Notice of Allowance Dated May 4, 2009; U.S. Appl. No. 11/787,908.

Final OA Dated Jun. 23, 2006; U.S. Appl. No. 10/771,015.

Non Final OA Dated Jan. 10, 2006; U.S. Appl. No. 10/771,015.

Non Fnal OA Dated Jul. 29, 2005; U.S. Appl. No. 10/771,015.

Notice of Allowance Dated Dec. 6, 2006; U.S. Appl. No. 10/771,015.

Restricition Requirement Dated May 4, 2005; U.S. Appl. No. 10/771,015.

Notice of Allowance Dated Jan. 5, 2009; U.S. Appl. No. 11/787,908.

Notice of Allowance Dated Sep. 9, 2008; U.S. Appl. No. 11/787,908.

Restriction Requirement Dated Jan. 16, 2008; U.S. Appl. No. 11/787,908.

Non Final OA Dated Apr. 3, 2009; U.S. Appl. No. 11/400,368.

Non Final OA Dated Oct. 7, 2008; U.S. Appl. No. 11/400,368.

Ex Parte Quayle Dated May 7, 2008; U.S. Appl. No. 11/787,908.

Notice of Allowance Dated Apr. 4, 2007; U.S. Appl. No. 10/956,218.

Notice of Allowance Dated Nov. 21, 2006; U.S. Appl. No. 10/956,218.

Non Final OA Dated May 17, 2006; U.S. Appl. No. 10/956,218.

Restriction Requirement Dated Jan. 12, 2006; U.S. Appl. No. 10/956,218.

* cited by examiner

1

SYSTEMS AND METHODS FOR INTEGRATED CIRCUITS COMPRISING MULTIPLE BODY BIASING DOMAINS

RELATED APPLICATIONS

This is a Divisional Application of, and claims priority to the following:
  commonly owned U.S. patent application Ser. No. 11/400,368, now U.S. Pat. No. 7,816,742, which in turn was a divisional application of:
  Ser. No. 10/956,722 filed on Sep. 30, 2004, which in turn was a Continuation-in-Part of:
  U.S. Pat. No. 7,205,758, filed Feb. 2, 2004.
All three applications are hereby incorporated herein by reference.

U.S. patent application Ser. No. 10/334,272, now U.S. Pat. No. 6,936,898, filed Dec. 31, 2002, entitled "Diagonal Deep Well Region for Routing Body-Bias Voltage for MOSFETs in Surface Well Regions" to Pelham and Burr, is hereby incorporated herein by reference in its entirety as reference material.

FIELD OF THE INVENTION

Embodiments in accordance with the present invention relate to systems and methods for integrated circuits comprising multiple body biasing domains.

BACKGROUND

It is desirable to adjust or change operating characteristics, for example, maximum frequency of operation, leakage current, static power consumption, slew rate and the like, of transistors and more complex circuits of an integrated circuit after the integrated circuit has been produced.

SUMMARY OF THE INVENTION

Therefore, systems and methods for integrated circuits comprising multiple body biasing domains would be highly desirable.

Accordingly, systems and methods for integrated circuits comprising multiple body biasing domains are disclosed. In accordance with a first embodiment of the present invention, a semiconductor structure comprises a substrate of first type material. A first closed structure comprising walls of second type material extends from a surface of the substrate to a first depth. A planar deep well of said second type material underlying and coupled to the closed structure extends from the first depth to a second depth. The closed structure and the planar deep well of said second type material form an electrically isolated region of the first type material. A second-type semiconductor device is disposed to receive a first body biasing voltage from the electrically isolated region of the first type material. A well of the second-type material within the electrically isolated region of the first type material is formed and a first-type semiconductor device is disposed to receive a second body biasing voltage from the well of second-type material.

In accordance with another embodiment of the present invention, first and second body biasing domains comprise both p and n-type devices. The p and n-type devices in the two body biasing domains are disposed to receive body biasing voltages that are operable to modify operational characteristics of corresponding circuitry.

DETAILED DESCRIPTION OF THE INVENTION

Figure 1:
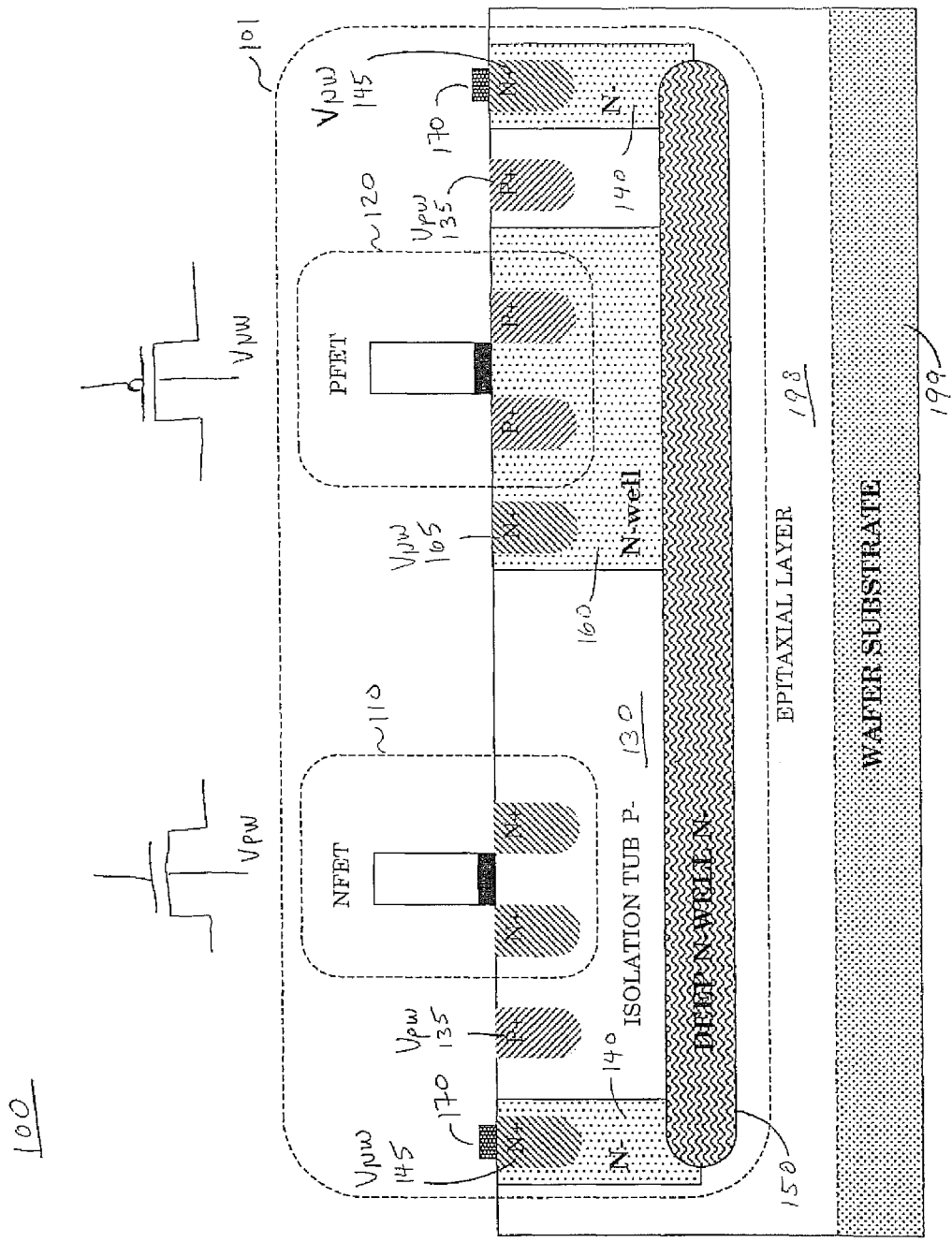
FIG. 1 illustrates a side sectional view of a portion of an integrated circuit, in accordance with embodiments of the present invention.

In the following detailed description of the present invention, systems and methods for integrated circuits comprising multiple body biasing domains, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Notation And Nomenclature

Some portions of the detailed descriptions which follow (e.g., process 400) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "storing" or "dividing" or "computing" or "testing" or "calculating" or "determining" or "storing" or "measuring" or "adjusting" or "generating" or "performing" or "comparing" or "synchronizing" or "accessing" or "retrieving" or "conveying" or "sending" or "resuming" or "installing" or "gathering" or the like, refer to the action and processes of a computer system, or similar electronic computing device that manipulates and transforms data represented as physical (electronic) quantities within the computer system's registers and memories into other data similarly represented as physical quantities within the computer system memories or registers or other such information storage, transmission or display devices.

Systems and Methods for Integrated Circuits Comprising Multiple Body Biasing Domains Embodiments in accordance with the present invention are described in the context of design and operation of integrated semiconductors. More particularly, embodiments of the present invention relate to systems and methods for integrated circuits comprising multiple body biasing domains. It is appreciated, however, that elements of the present invention may be utilized in other areas of semiconductor operation.

The following description of embodiments in accordance with the present invention is directed toward coupling a body-bias voltage to pFETs (or p-type metal oxide semiconductor field effect transistors [MOSFETS]) formed in surface N-wells and/or nFETs (or n-type MOSFETS) formed in surface P-wells when a p-type substrate and an N-well process are utilized. For example, the coupling can comprise a conductive sub-surface region of N-type doping, e.g., a deep N-well. It is to be appreciated, however, that embodiments in accordance with the present invention are equally applicable to coupling a body-bias voltage to nFETs (or n-type MOSFETS) formed in surface P-wells and/or pFETs (or p-type MOSFETS) formed in surface N-wells when an n-type substrate and a P-well process are utilized, e.g., comprising a conductive sub-surface region of p-type doping, e.g., a deep P-well. Consequently, embodiments in accordance with the present invention are well suited to semiconductors formed in both p-type and n-type materials, and such embodiments are considered within the scope of the present invention.

FIG. 1 illustrates a side sectional view of a portion of integrated circuit 100, in accordance with embodiments of the present invention. Integrated circuit 100 comprises a wafer substrate 199, typically of P+ type material, and an optional epitaxy layer 198, e.g., of P− type material. Substrate 199 and optional epitaxy layer 198 are frequently coupled to a ground reference in a variety of well-known manners, and can provide a ground reference to some of the circuitry of integrated circuit 100.

Integrated circuit 100 further comprises a body-biasing domain 101. Body biasing domain 101 comprises a portion of circuitry of integrated circuit 100, typically comprising both n-type metal oxide semiconductors (NMOS), e.g., NFET 110, and p-type metal oxide semiconductors (PMOS), e.g., PFET 120. Body biasing domain 101 enables circuits within body biasing domain 101, e.g., NFET 110 and/or PFET 120, to operate at body biasing voltages that are different from body biasing voltages utilized for other circuitry of integrated circuit 100 located outside of body biasing domain 101.

For example, other circuitry of integrated circuit 100 outside of body biasing domain 101 can function without an explicitly provided body bias, e.g., a source voltage is the same as the substrate voltage. Such an arrangement without an explicitly provided body biasing voltage is common, particularly for digital circuitry. Alternatively, other circuitry of integrated circuit 100 outside of body biasing domain 101 can function with explicitly applied biasing body voltages that are different in origin and/or value from those body biasing voltages applied within body biasing domain 101.

It is to be appreciated that a body biasing domain may generally comprise more than the single transistor of each type illustrated in FIG. 1. A body-biasing domain can comprise many transistors, for example, a complete functional circuit or logical sub-unit of a microprocessor, e.g., an arithmetic logic unit (ALU) or a memory controller.

N-type diffusion 140 forms a continuous "guard ring" or wall forming an outside border of body biasing domain 101. It is to be appreciated that embodiments in accordance with the present invention are well suited to a variety of shapes (as seen in plan view) for n-type diffusion 140. For example, a plan view of n-type diffusion 140 can be rectangular, have curving features, e.g., convex or non-convex, and/or a variety of other closed shapes, including self-intersecting shapes. Deep n-well 150 is formed at a depth approximately corresponding to the bottom of n-type diffusion 140. Deep n-well 150 underlies n-type diffusion 140 to form a bottom for body biasing domain 101. Deep n-well 150 in conjunction with N-type diffusion 140 forms an isolation tub 130 of p-type material. For example, material in isolation tub 130 is electrically isolated from wafer substrate 199 by deep n-well 150 in conjunction with n-type diffusion 140.

In accordance with alternative embodiments of the present invention, a body biasing domain border diffusion or guard ring can be topped with metallization. For example, n-type diffusion wall 140 can be coupled to and topped with metallization to form a metal "strap" 170. Metal strap 170 is generally substantially the same shape (in plan view) as an associated guard ring. Metal strap 170 generally has a lower resistance than n-type diffusion wall 140. Consequently, metal strap 170 can advantageously decrease a resistance of a border of a body-biasing domain, e.g., n-type diffusion wall 140. Such decreased resistance can improve a distribution of a body biasing voltage, e.g., $V_{NW}$, and/or decrease a need for contacts into a border of a body-biasing domain. Such a decrease in needed contacts can beneficially simplify routing of body biasing voltages as well as reduce integrated circuit area required for such contacts.

A body biasing voltage, $V_{PW}$, for n-type metal oxide semiconductors, e.g., NFET 110, is coupled to isolation tub 130 of p-type material via a plurality of contact terminals 135. Contact terminals 135 can be coupled to metallization of integrated circuit 100. By adjusting a body biasing voltage of a transistor, e.g., body biasing voltage $V_{PW}$, the threshold voltage of that transistor can be adjusted, e.g., increased or decreased, relative to the nominal threshold voltage of that transistor without an applied body biasing voltage.

It is appreciated that p-type metal oxide semiconductors are generally formed in n-type material. N-well 160 is formed within isolation tub 130 of p-type material. It is generally desirable for N-well 160 to extend into deep n-well 150. For example, n-well 160 can be formed to approximately the same depth as n-well 140.

A body biasing voltage, $V_{NW}$, for p-type metal oxide semiconductors, e.g., PFET 120, is coupled to n-well 160 via optional contact terminal 165. Alternatively, $V_{NW}$ can be coupled via contact terminals 145, n diffusion 140 and deep n-well 150 to n-well 160. Contact terminals 165 and/or contact terminals 145 can be coupled to metallization of integrated circuit 100. By adjusting a body biasing voltage of a transistor, e.g., body biasing voltage $V_{NW}$, the threshold voltage of that transistor can be adjusted, e.g., increased or decreased, relative to the nominal threshold voltage of that transistor without an applied body biasing voltage.

Because integrated circuits typically comprise both n-type and p-type devices, e.g., complimentary metal oxide semiconductors (CMOS), the term "body biasing domain" can be used to represent or refer to a group of n-type devices and p-type devices sharing one body biasing voltage or a pair of body biasing voltages, sometimes also referred to as a "set" of body biasing voltages. The set of body biasing voltages will generally be utilized in tandem to adjust operating characteristics of the group of devices as a whole. For example, generally a set of body biasing voltages will be adjusted to achieve similar adjustments to operating characteristics of both n-type and p-type devices, e.g., increase threshold voltages of both n-type and p-type devices. However, it is to be appreciated that it may be desirable to perform different adjustments of p-type device and n-type devices within a body-biasing domain. For example, it may be desirable to increase the threshold voltage of n-type devices while decreasing the threshold voltage of p-type devices. Similarly, it may be desirable to decrease the threshold voltage of n-type devices and not adjust the threshold voltage of p-type devices. All such paired adjustments are considered within the scope of embodiments of the present invention.

Such adjustments of threshold voltage generally result in changes to other characteristics of a transistor, for example, maximum frequency of operation, leakage current and/or power consumption. It is to be appreciated that such changes to transistor characteristics can be realized without changes to the physical structure of the transistor. More particularly, such changes to transistor characteristics can be realized in a time-variable nature after an integrated circuit has been produced. For example, a transistor within a body biasing domain can be operated at a first set of characteristics corresponding to a first applied body biasing voltage at one time, and the same transistor can be operated at a second set of characteristics corresponding to a second applied body biasing voltage at a second time.

Figure 5:
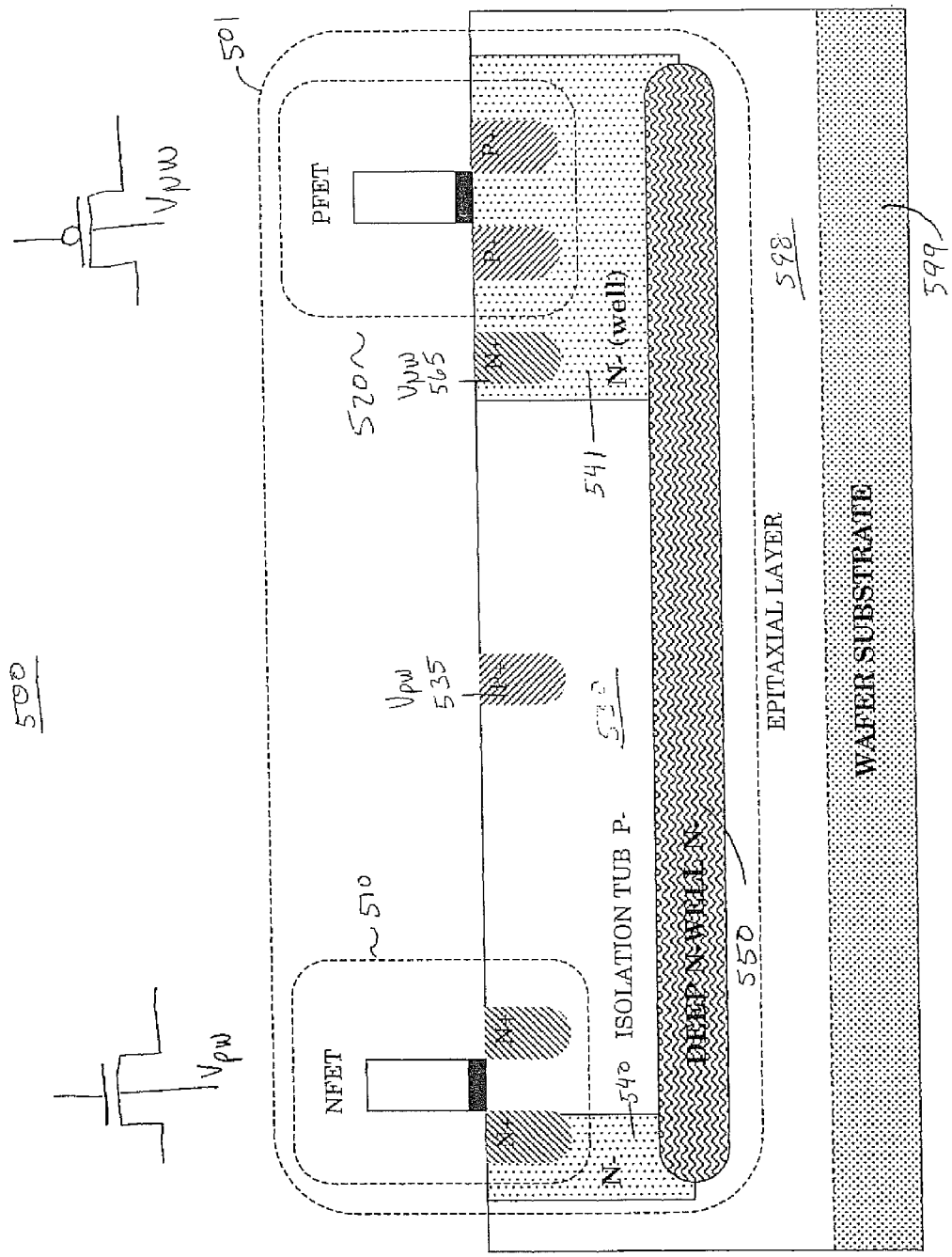
FIG. 5 illustrates a side sectional view of a portion of integrated circuit, in accordance with other embodiments of the present invention.

In accordance with another embodiment of the present invention, a body biasing domain border diffusion can comprise portions of active devices. FIG. 5 illustrates a side sectional view of a portion of integrated circuit 500, in accordance with embodiments of the present invention. It is to be appreciated that FIG. 5 does not depict identical structures to those of FIG. 1. However, there are many similarities, and similar features are given similar numbers, e.g., 150/550 for a deep n-well that forms a portion of an isolation structure that isolates a region of p material.

Integrated circuit 500 comprises a wafer substrate 599, typically of P+ type material, and an optional epitaxy layer 598, e.g., of P− type material. Substrate 599 and optional epitaxy layer 598 are frequently coupled to a ground reference in a variety of well-known manners, and can provide a ground reference to some of the circuitry of integrated circuit 500.

Integrated circuit 500 further comprises a body-biasing domain 501. Body biasing domain 501 comprises a portion of circuitry of integrated circuit 500, typically comprising both n-type metal oxide semiconductors (NMOS), e.g., NFET 510, and p-type metal oxide semiconductors (PMOS), e.g., PFET 520. Body biasing domain 501 enables circuits within body biasing domain 501, e.g., NFET 510 and/or PFET 520, to operate at body biasing voltages that are different from body biasing voltages utilized for other circuitry of integrated circuit 500 located outside of body biasing domain 501.

For example, other circuitry of integrated circuit 500 outside of body biasing domain 501 can function without an explicitly provided body bias, e.g., a source voltage is the same as the substrate voltage. Such an arrangement without an explicitly provided body biasing voltage is common, particularly for digital circuitry. Alternatively, other circuitry of integrated circuit 500 outside of body biasing domain 501 can function with explicitly applied biasing body voltages that are different in origin and/or value from those body biasing voltages applied within body biasing domain 501.

It is to be appreciated that a body biasing domain may generally comprise more than the single transistor of each type illustrated in FIG. 5. A body-biasing domain can comprise many transistors, for example, a complete functional circuit or logical sub-unit of a microprocessor, e.g., an arithmetic logic unit (ALU) or a memory controller.

N-type diffusion 540 and 541 form a continuous "guard ring" or wall forming an outside border of body biasing domain 501. It is to be appreciated that item 540 and item 541 are different portions of the same n-type diffusion structure. It is to be further appreciated that embodiments in accordance with the present invention are well suited to a variety of shapes (as seen in plan view) for n-type diffusions 540 and 541. For example, a plan view of n-type diffusions 540 and 541 can be rectangular, have curving features and/or a variety of other closed shapes. Deep n-well 550 is formed at a depth approximately corresponding to the bottom of n-type diffusions 540 and 541. Deep n-well 550 underlies n-type diffusions 540 and 541 to form a bottom for body biasing domain 501. Deep n-well 550 in conjunction with n-type diffusions 540 and 541 forms an isolation tub 530 of p-type material. For example, material in isolation tub 530 is electrically isolated from wafer substrate 599 by deep n-well 550 in conjunction with n-type diffusion 540.

A body biasing voltage, $V_{PW}$, for n-type metal oxide semiconductors, e.g., NFET 510, is coupled to isolation tub 530 of p-type material via a plurality of contact terminals 535. Contact terminals 535 can be coupled to metallization of integrated circuit 500. By adjusting a body biasing voltage of a transistor, e.g., body biasing voltage $V_{PW}$, the threshold voltage of that transistor can be adjusted, e.g., increased or decreased, relative to the nominal threshold voltage of that transistor without an applied body biasing voltage.

It is appreciated that p-type metal oxide semiconductors are generally formed in n-type material. In accordance with embodiments of the present invention, diffusion 541 (a segment of n-type diffusions 540 and 541) can be utilized as an n-type "well" for the formation of p-type metal oxide semiconductors, e.g., PFET 520.

A body biasing voltage, $V_{NW}$, for p-type metal oxide semiconductors, e.g., PFET 520, is coupled to n-well 541 via contact terminal 565. By adjusting a body biasing voltage of a transistor, e.g., body biasing voltage $V_{NW}$, the threshold voltage of that transistor can be adjusted, e.g., increased or decreased, relative to the nominal threshold voltage of that transistor without an applied body biasing voltage.

It is to be appreciated that a terminal of NFET 510 is formed within n-type diffusion 540 (a segment of n-type diffusions 540 and 541). In accordance with embodiments of the present invention, diffusion walls forming a border of a body-biasing domain, e.g., n-type diffusion 540, are well suited to comprising portions, e.g., terminals, of active devices.

In accordance with embodiments of the present invention, the novel structures placing active devices in body biasing diffusion walls or "guard rings" forming a border of a body-biasing domain, can advantageously reduce the integrated circuit space required for such border structures. In addition, such novel structures can also be of benefit in retrofitting body-biasing systems into pre-existing non-body biased designs.

Figure 2:
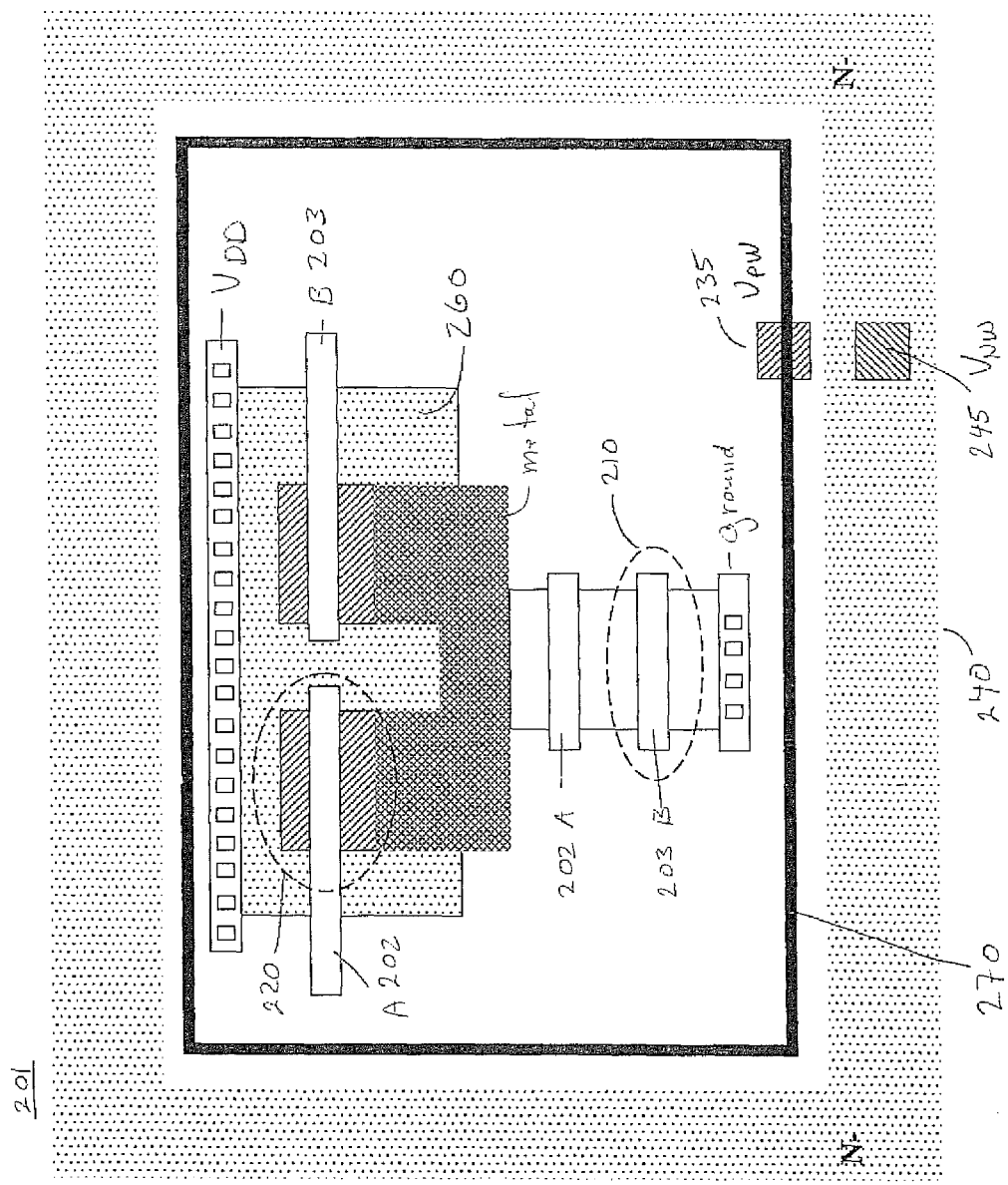
FIG. 2 illustrates a plan view of an exemplary layout of a logic gate within a body-biasing domain, in accordance with embodiments of the present invention.

FIG. 2 illustrates a plan view of an exemplary layout of a two-input NAND gate within a body-biasing domain 201, in accordance with embodiments of the present invention. Signal "A" 202 and signal "B" 203 are the inputs to the NAND gate. It is to be appreciated that FIG. 2 does not depict identical structures to those of FIG. 1. However, there are many similarities, and similar features are given similar numbers, e.g., 160/260 for n-wells within an isolated region of p-type material.

Body biasing domain 201 comprises a "ring" or wall 240 of n-type diffusion. A deep n well (not shown for clarity) underlies body-biasing domain 201 within the closed borders of n-type diffusion 240. Above the deep n well is an isolation tub (not shown for clarity) of p-type material. The deep n well generally corresponds to deep n well 150 of FIG. 1 and the isolation tub generally corresponds to isolation tub 130 of FIG. 1.

An NFET 210 is formed within the isolation tub, similarly to NFET 110 of FIG. 1. A body biasing voltage, $V_{PW}$, for n-type metal oxide semiconductors, e. g., NFET 210, is coupled to the isolation tub of p-type material via a plurality of contact terminals 235. Contact terminals 235 are typically coupled to metallization of an integrated circuit. By adjusting a body biasing voltage of a transistor, e.g., body biasing voltage $V_{PW}$, the threshold voltage of that transistor, e.g., NFET 210, can be adjusted, e.g., increased or decreased, relative to the nominal threshold voltage of that transistor without an applied body biasing voltage.

PFET 220 is formed within n-well 260. N-well 260 is generally analogous to n-well 160 of FIG. 1. A body biasing voltage, $V_{NW}$, for p-type metal oxide semiconductors, e.g., PFET 220, is coupled via contact terminals 245, n diffusion 240 and the deep n-well to n-well 260. Optionally, contacts can be made directly to n-well 260. Contact terminals made directly to n-well 260 and/or contact terminals 245 are typically coupled to metallization of an integrated circuit. By adjusting a body biasing voltage of a transistor, e.g., body biasing voltage $V_{NW}$, the threshold voltage of that transistor, e.g., PFET 220, can be adjusted, e.g., increased or decreased, relative to the nominal threshold voltage of that transistor without an applied body biasing voltage.

Optionally, a closed region of p-type diffusion 270, similar to n-type diffusion 240 can be constructed within the borders of n-type diffusion 240. P-type diffusion 270 can aid in coupling body biasing voltage $V_{PW}$ to the isolation tub, and provides further isolation to the body terminals of devices within body biasing domain 201. In accordance with embodiments of the present invention, closed region of p-type diffusion 270 can be topped with metallization to form a structure similar to that of metal strap 170 of FIG. 1.

It is to be appreciated that, in accordance with embodiments of the present invention, active devices, or portions of active devices can be formed in closed region of p-type diffusion 270 in a manner complementary to the descriptions of FIG. 5.

Returning to FIG. 2, coupling to n-type diffusion 240, p-type diffusion 270 and/or an isolation tub can advantageously be made via controlled collapse chip connection (C4) contacts. For example, contact 235 can be a C4 contact.

This novel body biasing domain enables a first group of both n-type and p-type devices to receive body biasing voltages. Beneficially, such body biasing voltages can be applied to the first group of devices independent of a second group of devices, located outside of this structure. For example, body biasing voltages can be applied to devices of the first group at the same time that no explicit body biasing voltages are applied to devices of the second group.

In accordance with another embodiment of the present invention, multiple body biasing domains can be embodied within a single integrated circuit. Such multiple body biasing domains enable multiple groups of both n-type and p-type devices to receive body biasing voltages that act upon different groups in different manners. For example, a first group of devices within a first body biasing domain can have body biasing voltages applied that decrease leakage current and/or static power. Applying such body biasing voltages can beneficially decrease total power consumption when, for example, the function of the first group of devices is (temporarily) not required. Simultaneously, for example, a second group of devices within a second body biasing domain can have body biasing voltages applied that increase a maximum frequency of operation for some or all of those devices in the second body biasing domain.

Figure 3:
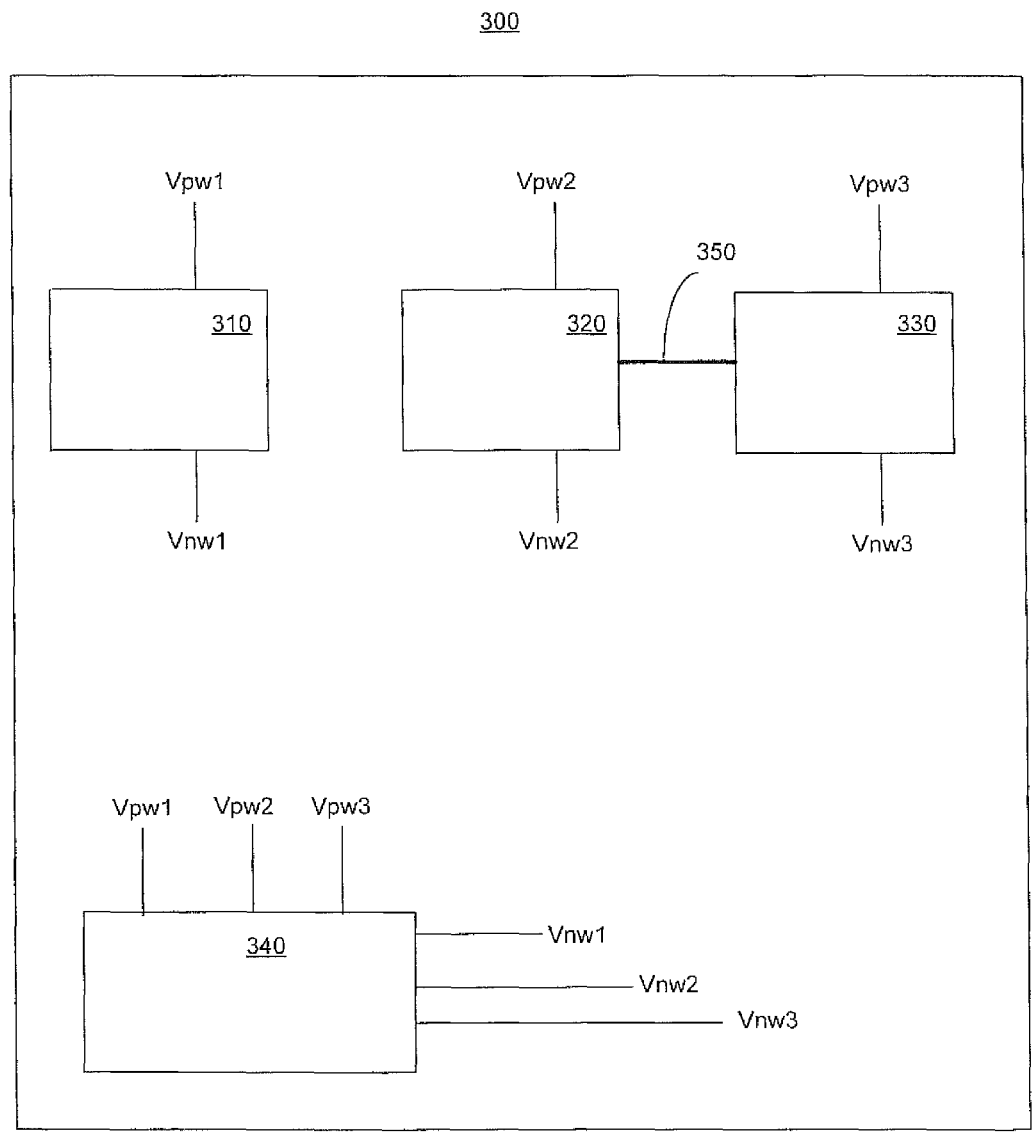
FIG. 3 illustrates an integrated circuit comprising multiple independent body biasing domains, in accordance with embodiments of the present invention.

FIG. 3 illustrates an integrated circuit 300 comprising multiple independent body biasing domains, in accordance with embodiments of the present invention. Integrated circuit 300 comprises three independent body biasing domains, 310, 320 and 330. It is to be appreciated that, in general, though not required, the three independent body biasing domains, 310, 320 and 330 can operate with three different operating voltages, e.g., Vdd1, Vdd2 and/or Vdd3.

Body biasing domain 310 is coupled to $V_{PW1}$ and $V_{NW1}$ to provide body biasing voltages to n-type devices and p-type devices within body biasing domain 310. Similarly, body biasing domain 320 is coupled to $V_{PW2}$ and $V_{NW2}$ to provide body biasing voltages to n-type devices and p-type devices within body biasing domain 320, and body biasing domain 330 is coupled to $V_{PW3}$ and $V_{NW3}$ to provide body biasing voltages to n-type devices and p-type devices within body biasing domain 330. It is appreciated that each body biasing domain 310, 320 and 330 electrically isolates the bodies of devices with one domain from the devices in the other domains. Further, each body biasing domain 310, 320 and 330 electrically isolates the bodies of devices with one domain from the bodies of any other devices on integrated circuit 300, e.g., those devices constructed directly into a substrate.

As a beneficial consequence, the body biasing voltages applied to the multiple body biasing domains need not be equal. For example, $V_{NW1}$ is not required to be equal to $V_{NW2}$ nor is $V_{NW1}$ required to be equal to $V_{NW3}$. Advantageously, application of body biasing voltages can be utilized to achieve differing effects among multiple body biasing domains. For example, devices in a first domain can be "sped" up, e.g., by reducing $V_{NW1}$ and increasing $V_{PW1}$. Devices in a second domain can be slowed down, e.g., by increasing $V_{NW2}$ and decreasing $V_{PW2}$. Devices in a third domain can be slowed down to the point that they no longer perform their desired function, e.g., a multiplier unit in a microprocessor can no longer multiply at the microprocessor clock rate.

Such a capability to slow down a group of devices to a point that they are "off" can be highly beneficial in reducing static power consumption. For example, if the exemplary multiplier unit is not needed, e.g., no multiply instructions are to be executed, for a period of time, the multiplier unit can be greatly slowed down, e.g., turned "off" via control of body biasing voltages. This technique can produce enhanced power savings compared to the conventional art method of only turning off a clock signal to unused circuitry.

The use of multiple body biasing domains adds flexibility to circuit design and/or manufacturing processes. For example, if circuitry within body biasing domain 310 was designed to function under nominal manufacturing process conditions, a particular instance of the integrated circuit may not function due to process variations, for example rendering the circuit "too slow." Applying a pair of body biasing voltages to body biasing domain 310 can modify the operation of such circuitry such that it becomes functional under the biasing conditions, without detrimental effect to other circuitry outside of body biasing domain 310.

Alternatively, circuitry within body biasing domain 310 could be designed not to function under nominal manufacturing process conditions. For example, the manufacturing process conditions could be "tuned" to skew the manufacturing distribution toward lower power, slower parts. Such skewing can be acceptable for many circuits on the integrated circuit, for example. However, there can be some circuits that are "designed" not to work at projected process conditions. The behavior of such circuits can be adjusted after manufacture, e.g., during operation of the integrated circuit, by the application of body biasing voltage(s) such that the circuits function under biased operational conditions.

It is appreciated that locating such circuitry in an independent body biasing domain of the integrated circuit enables such adjustments without undesired adjustment of the other, working, circuitry of the integrated circuit.

FIG. 3 further illustrates optional body biasing voltage source 340. Optional body biasing voltage source 340 produces multiple body biasing voltages for use by the multiple body biasing domains of integrated circuit 300. Alternatively, some or all body biasing voltages can be coupled from off-chip sources.

FIG. 3 also illustrates optional signal 350 traveling between body biasing domain 320 and body biasing domain 330. Although the multiple body biasing domains isolate body terminals of devices within a domain from body terminals of devices within another domain (or the substrate), they do not necessarily isolate all signals in one domain from other domains. In general, it is beneficial to access signals generated in one domain from other domains.

It is to be appreciated that embodiments in accordance with the present invention can be combined with embodiments of co-pending commonly-owned U.S. patent application Ser. No. 10/334,272 filed Dec. 31, 2002, entitled "Diagonal Deep Well Region for Routing Body-Bias Voltage for MOSFETs in Surface Well Regions" to Pelham and Burr, which is hereby incorporated herein by reference in its entirety. More particularly, body-biasing domains described herein can be utilized in integrated circuits embodying systems and techniques of routing body biasing voltage described in the referenced Application. For example, a body-biasing domain can be constructed within a region of an integrated circuit comprising diagonal deep wells routing body-biasing voltages. Alternatively, body-biasing domains can be utilized in a first portion of an integrated circuit while diagonal deep wells are utilized in a second portion of the integrated circuit.

Figure 4:
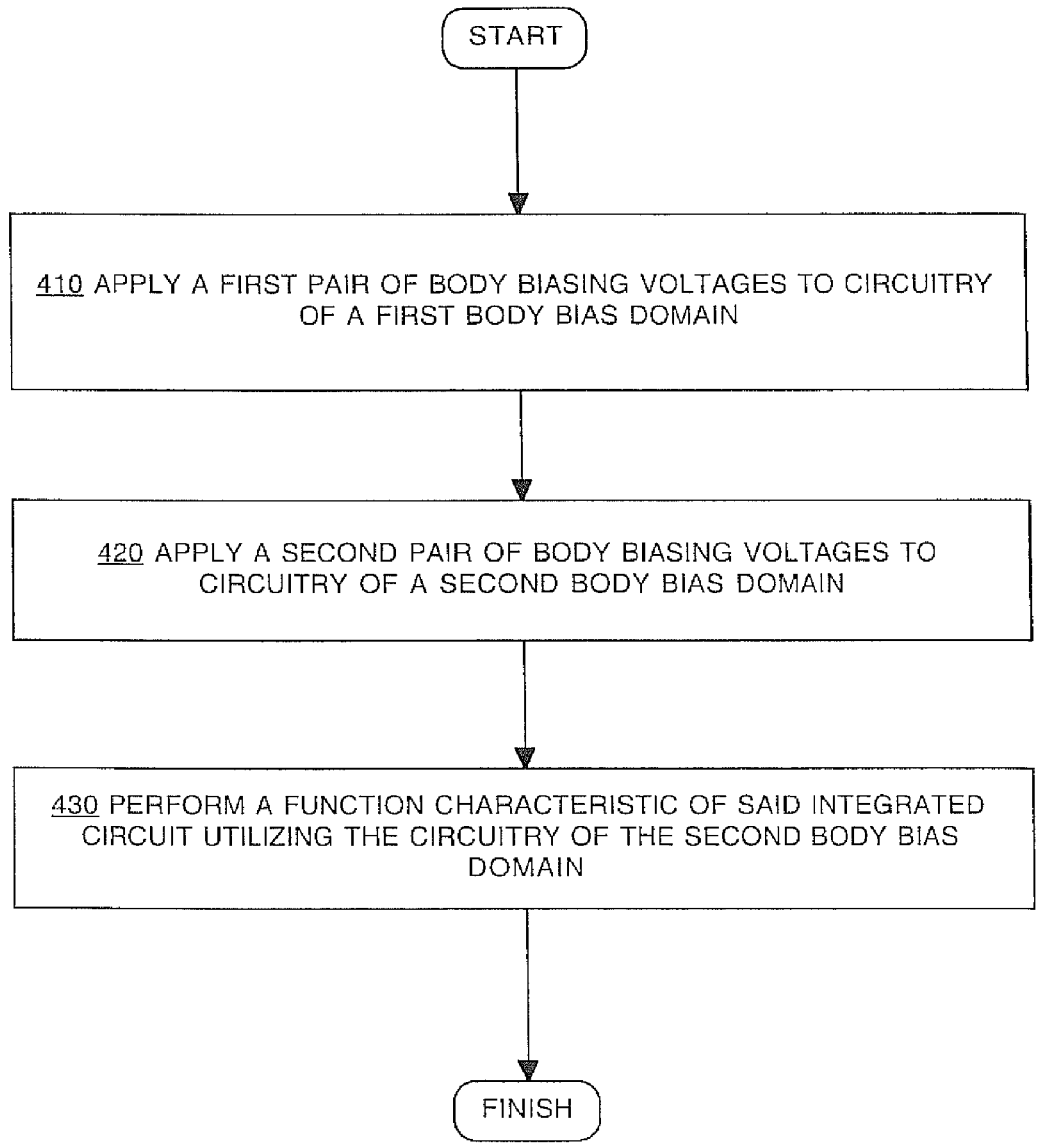
FIG. 4 illustrates a method of operating an integrated circuit, in accordance with embodiments of the present invention.

FIG. 4 illustrates a method 400 of operating an integrated circuit, in accordance with embodiments of the present invention. In 410, a first pair of body biasing voltages is applied to circuitry of a first body-biasing domain. In 420, a second pair of body biasing voltages is applied to circuitry of a second body-biasing domain.

In 430 a function characteristic of the integrated circuit utilizing the circuitry of the second body-biasing domain is performed. For example, if the circuitry of the second body biasing domain comprises a multiplier unit, a multiply function is performed. Embodiments in accordance with the present invention are well suited to a wide variety of functions that can be implemented within integrated circuits.

Embodiments in accordance with the present invention, systems and methods for integrated circuits comprising multiple body biasing domains, are thus described. While the present invention has been described in particular embodiments, it should be appreciated that the present invention should not be construed as limited by such embodiments, but rather construed according to the below claims.

What is claimed is:

1. A method of operating an integrated circuit comprising:
    applying a first pair of body biasing voltages to circuitry of a first body biasing domain;
    applying a second pair of body biasing voltages to circuitry of a second body biasing domain,
    wherein said first pair of body biasing voltages is different in origin from said second pair of body biasing voltages; and
    responsive to said applying a second pair of body biasing voltages, performing a function characteristic of said integrated circuit, said function utilizing said circuitry of a second body biasing domain as biased by the second pair of body biasing voltages,
    wherein said first body biasing domain comprises a deep well of opposite conductivity type to a substrate of said integrated circuit for isolating said first body biasing domain from said substrate.

2. The method of claim 1 wherein said applying said first pair of body biasing voltages increases a maximum frequency of operation for said circuitry of said first body biasing domain compared to nominal and wherein said applying said second pair of body biasing voltages results in a decreased maximum frequency of operation for said circuitry of said second body biasing domain compared to nominal.

3. The method of claim 1 wherein said applying said first pair of body biasing voltages decreases leakage current of said circuitry of said first body biasing domain compared to nominal.

4. The method of claim 3 wherein said applying of said first pair of body biasing voltages renders said circuitry of said first body biasing domain unable to perform a desired function.

5. The method of claim 4 wherein said circuitry of said first body biasing domain performs a desired prescribed function.

6. A method according to claim 1 wherein said circuitry of said first body biasing domain does not produce a desired prescribed function without application of said first pair of body biasing voltages.

7. A method of operating an integrated circuit comprising:
    applying a first pair of body biasing voltages to first circuitry of a first body biasing domain;
    applying a second pair of body biasing voltages to second circuitry of a second body biasing domain,
    wherein said first body biasing domain isolates body terminals of said first circuitry from body terminals of said second circuitry; and
    responsive to said applying a second pair of body biasing voltages, performing a function characteristic of said integrated circuit, said function utilizing said circuitry of said first body biasing domain and said circuitry of said second body biasing domain,
    wherein said first body biasing domain comprises a deep well of opposite conductivity type to a substrate of said integrated circuit for isolating said first body biasing domain from said substrate.

8. The method of claim 7 wherein said applying said first pair of body biasing voltages increases a maximum frequency of operation for said circuitry of said first body biasing domain compared to nominal and wherein said applying said second pair of body biasing voltages results in a decreased maximum frequency of operation for said circuitry of said second body biasing domain compared to nominal.

9. The method of claim 7 wherein said applying said first pair of body biasing voltages decreases leakage current of said circuitry of said first body biasing domain compared to nominal.

10. The method of claim 9 wherein said applying of said first pair of body biasing voltages renders said circuitry of said first body biasing domain unable to perform a desired function.

11. The method of claim 10 wherein said circuitry of said first body biasing domain performs a desired prescribed function.

12. The method of claim 7 wherein said circuitry of said first body biasing domain does not produce a desired prescribed function without application of said first pair of body biasing voltages.

13. The method of claim 7 wherein said performing a function comprises transferring a signal between said circuitry of said first body biasing domain and said circuitry of said second body biasing domain.

14. An article of manufacture including a computer readable medium having instructions stored thereon that, responsive to execution by a computing device, cause said computing device to perform operations comprising:
 applying a first pair of body biasing voltages to circuitry of a first body biasing domain of an integrated circuit;
 applying a second pair of body biasing voltages to circuitry of a second body biasing domain of said integrated circuit; and
 responsive to said applying a second pair of body biasing voltages, performing a function characteristic of said integrated circuit, said function utilizing said circuitry of a second body biasing domain as biased by the second pair of body biasing voltages,
 wherein said first body biasing domain comprises a deep well of opposite conductivity type to a substrate of said integrated circuit for isolating said first body biasing domain from said substrate, and
 wherein said integrated circuit is configured to isolate said first pair of body biasing voltages from said second pair of body biasing voltages.

15. The article of manufacture of claim 14 wherein said applying said first pair of body biasing voltages increases a maximum frequency of operation for said circuitry of said first body biasing domain compared to nominal and wherein said applying said second pair of body biasing voltages results in a decreased maximum frequency of operation for said circuitry of second body biasing domain compared to nominal.

16. The article of manufacture of claim 14 wherein said applying said first pair of body biasing voltages decreases leakage current of said circuitry of said first body biasing domain compared to nominal.

17. The article of manufacture of claim 16 wherein said applying of said first pair of body biasing voltages renders said circuitry of said first body biasing domain unable to perform a desired function.

18. The article of manufacture of claim 17 wherein said circuitry of said first body biasing domain performs a desired prescribed function.

19. The article of manufacture of claim 14 wherein said circuitry of said first body biasing domain does not produce a desired prescribed function without application of said first pair of body biasing voltages.

20. The article of manufacture of claim 15 wherein said performing a function comprises transferring a signal between said circuitry of said first body biasing domain and said circuitry of said second body biasing domain.

* * * * *

UNITED STATES PATENT AND TRADEMARK OFFICE
CERTIFICATE OF CORRECTION

PATENT NO. : 8,420,472 B2
APPLICATION NO. : 12/873062
DATED : April 16, 2013
INVENTOR(S) : Koniaris et al.

It is certified that error appears in the above-identified patent and that said Letters Patent is hereby corrected as shown below:

Title Page 2, in Item (56), under "FOREIGN PATENT DOCUMENTS", in Column 2, Line 2, delete "409185589" and insert -- 09185589 --, therefor.

Title Page 3, in Item (56), under "OTHER PUBLICATIONS", in Column 1, Line 10, delete "al,;" and insert -- al.; --, therefor.

Title Page 3, in Item (56), under "OTHER PUBLICATIONS", in Column 2, Line 3, delete "Fnal" and insert -- Final --, therefor.

Title Page 3, in Item (56), under "OTHER PUBLICATIONS", in Column 2, Line 5, delete "Restricition" and insert -- Restriction --, therefor.

In the Specifications:

In Column 1, Line 12, delete "Ser." and insert -- U.S. patent application Ser. --, therefor.

In Column 1, Line 13, delete "was a" and insert -- is a --, therefor.

In Column 2, Line 59, delete ""storing"".

In Column 3, Line 19, delete "[MOSFETS])" and insert -- [MOSFETs]) --, therefor.

In Column 3, Line 20, delete "MOSFETS)" and insert -- MOSFETs) --, therefor.

In Column 3, Lines 26-27, delete "MOSFETS)" and insert -- MOSFETs) --, therefor.

In Column 3, Line 28, delete "MOSFETS)" and insert -- MOSFETs) --, therefor.

Signed and Sealed this
Twentieth Day of August, 2013

Teresa Stanek Rea
*Acting Director of the United States Patent and Trademark Office*

CERTIFICATE OF CORRECTION (continued)
U.S. Pat. No. 8,420,472 B2

In Column 4, Line 49, delete "n-well 140." and insert -- n-well 150. --, therefor.

In Column 4, Line 53, delete "n diffusion 140" and insert -- n-type diffusion 140 --, therefor.

In Column 6, Line 36, delete "diffusion 541" and insert -- n-type diffusion 541 --, therefor.

In Column 7, Line 5, delete "n well" and insert -- n-well --, therefor.

In Column 7, Line 7, delete "n well" and insert -- n-well --, therefor.

In Column 7, Line 8, delete "n well" and insert -- n-well --, therefor.

In Column 7, Line 9, delete "n well" and insert -- n-well --, therefor.

In Column 7, Lines 26-27, delete "n diffusion 240" and insert -- n-type diffusion 240 --, therefor.

In Column 9, Lines 16-17, delete "other, working," and insert -- other working --, therefor.

In the Claims:

In Column 10, Line 36, in Claim 6, delete "A method" and insert -- The method --, therefor.